United States Patent [19]

Takahashi

[11] Patent Number: 5,062,113
[45] Date of Patent: Oct. 29, 1991

[54] LIGHT SOURCE DRIVE DEVICE

[75] Inventor: Akira Takahashi, Shizuoka, Japan

[73] Assignee: Hamamatsu Photonics K.K., Shizuoka, Japan

[21] Appl. No.: 530,744

[22] Filed: May 30, 1990

[30] Foreign Application Priority Data

Jun. 16, 1989 [JP] Japan ................... 1-153704

[51] Int. Cl.⁵ ............................................ H01S 3/103
[52] U.S. Cl. ........................................ 372/25; 372/38; 372/82; 307/106
[58] Field of Search ................ 372/25, 38, 81, 82; 307/166, 601

[56] References Cited

U.S. PATENT DOCUMENTS 3,614,447 10/1971 Paoli et al. ..................... 372/38
4,928,248 5/1990 Takahashi et al. ............. 372/38

FOREIGN PATENT DOCUMENTS

0244054A2 4/1987 European Pat. Off. ......... 372/81

OTHER PUBLICATIONS

Hewlett Packard Application Note 918, "Pulse and Waveform Generation with Recovery Diodes", Oct. 1984.
"Simple Picosecond Pulse Generation Scheme for Injected Lasers", Electronics Letters, vol. 16, No. 15, Jul. 17, 1980.

Primary Examiner—Frank Gonzalez
Assistant Examiner—Susan S. Morse
Attorney, Agent, or Firm—Finnegan, Henderson, Farabow, Garrett and Dunner

[57] ABSTRACT

A repetitive voltage signal, such as a sinusoidal wave, is supplied to the anode of a step-recovery diode through an inductor. A variable voltage source is connected to the cathode of the step-recovery diode. Conduction of the step-recovery diode and cut-off of the reverse current flowing through it are repeated with a period identical to the period of the repetitive voltage signal. On account of the abrupt reverse current cut-off characteristic of the step-recovery diode, a voltage is induced in the inductor when the reverse current is cut off, thereby producing an abrupt voltage change at the junction point between the inductor and the step-recovery diode. This abrupt voltage change is converted by differentiation into a short pulse to drive a semiconductor laser diode.

4 Claims, 2 Drawing Sheets

LIGHT SOURCE DRIVE DEVICE

BACKGROUND OF THE INVENTION

The present invention relates to a device for driving a light source such as a semiconductor light-emitting element, in particular a semiconductor laser diode (LD), in such a way that it outputs light (laser light) of very short pulses having duration of several tens of picoseconds at a desired repetition frequency.

In order to produce laser light of very short pulses having duration of several tens of picoseconds from laser diodes, the latter must be supplied with electric pulses having duration of several hundreds of picoseconds. Such short electric pulses are commonly produced by utilizing the avalanche breakdown of avalanche transistors or with comb generators.

The repetition frequency of avalanche transistors is limited to about 100 kHz by the recovery time of avalanche breakdown and the charge time required to build up a high voltage. On the other hand, with comb generators, the repetition frequency of more than 1 GHz can be obtained, but the use of a resonance circuit precludes operation at variable repetition frequencies.

There is another type of a drive device which can produce such short electric pulses at variable repetition frequencies by utilizing the abrupt reverse current cut-off characteristic of a step-recovery diode. However, in this device the upper limit of the repetition frequency is about 10 MHz.

SUMMARY OF THE INVENTION

An object, therefore, of the present invention is to provide a light source drive device that is capable of generating short electric pulses having duration of several hundreds of picoseconds at variable repetition frequencies over the range of from several megahertz to several hundreds of megahertz.

A light source drive device according to the invention comprises:
  means for generating a repetitive voltage signal;
  means for modifying the repetitive voltage signal to an output voltage waveform having an abrupt change, the modifying means comprising:
    inductor means connected to the repetitive voltage signal generating means,
    voltage source means for producing a reference voltage, and
    step-recovery diode means connected at one end to the voltage source means and at the other end to the inductor means, the other end being an output terminal of the modifying means; and
  means for differentiating the output voltage waveform of the modifying means to produce a pulse voltage to drive a light source.

When the modifying means is supplied with a repetitive voltage signal, such as a sinusoidal wave, conduction of the step-recovery diode and cut-off of the reverse current flowing through it are repeated with a period identical to the period of the repetitive voltage signal. On account of the abrupt reverse current cut-off characteristic of the step-recovery diode, a voltage is induced in the inductor means when the reverse current is cut off, thereby producing an abrupt voltage change at the output of the modifying means. This voltage change is converted into a short electric pulse by the differentiating means and supplied to the light source such as a semiconductor laser diode. The repetition frequency of such short electric pulses is equal to the frequency of the input repetitive voltage signal. Therefore, by changing the frequency of the input repetitive voltage signal, laser light of very short pulses having a repetition frequency identical to the input frequency can be obtained. It is fairly easy to produce a repetitive voltage signal having a desired frequency over the range of from several megahertz to several hundreds of megahertz.

DETAILED DESCRIPTION OF THE PREFERRED EMBODIMENT

Figure 1:
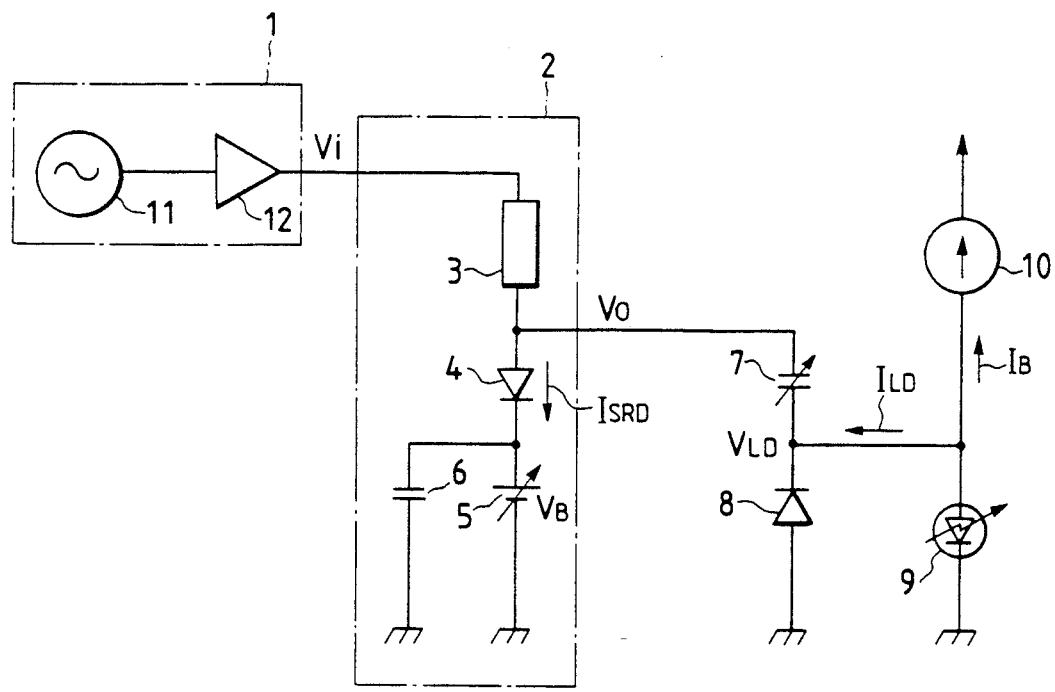
FIG. 1 is a block diagram showing a light source drive device according to an embodiment of the present invention.

FIG. 1 is a block diagram showing a light source drive device according to an embodiment of the present invention.

Shown by numeral 1 is a sinusoidal voltage generating means that is composed of a sinusoidal wave generator 11 and an amplifier 12 and which outputs a sinusoidal voltage $V_i$ of a desired amplitude. The sinusoidal generator 11 is capable of outputting a sinusoidal wave having a desired frequency in the range of 10–200 MHz. Shown by numeral 2 is a voltage modifying means that modifies the waveform of the sinusoidal voltage $V_i$ from the sinusoidal voltage generating means 1 to produce an abrupt voltage change for each period and which outputs a modified waveform as a voltage $V_o$. This voltage modifying means 2 is composed of an inductor 3, a step-recovery diode 4, a variable voltage source 5 and a capacitor 6. The anode of the step-recovery diode 4 is connected to one end of the inductor 3 and the cathode is connected to the positive electrode of the variable voltage source 5. The inductor 3 has an inductance L and its other end serving as an input terminal is connected to the output terminal of the sinusoidal voltage generating means 1. The variable voltage source 5 is provided to fix the cathode potential of the step-recovery diode 4 at $V_B$, and its negative electrode is grounded. The junction point of the step-recovery diode 4 and the variable voltage source 5 is connected to the capacitor 6 which is grounded at the other end. By this arrangement, the cathode of the step-recovery diode 4 is grounded in the sense of ac operation. The output voltage $V_o$ of the voltage modifying means 2 having the configuration described above is produced at the junction point of the inductor 3 and the step-recovery diode 4.

The step-recovery diode 4 which plays an important role in the embodiment being considered will operate in the following manner. When, under the condition that a forward current $I_f$ is flowing through an ordinary diode, a reverse voltage is applied to cut off the diode, a reverse current $I_r$ will flow through the diode being in a low impedance state as long as the stored charge remains. The time $T_s$ during which the diode conducts in the reverse direction is expressed by:

$$T_S = \tau \cdot I_f / I_r \tag{1}$$

where $\tau$ is the lifetime of minority carriers. Ordinary diodes are designed to have a small value of $T_s$, but the step-recovery diode 4, in which the duration of $T_s$ may be long, is so designed that the reverse current $I_r$ will become extinct at the end of $T_s$ within a very short transition time of about several hundreds of picoseconds. The device according the embodiment under consideration also utilizes this abrupt reverse current cut-off characteristic of the step-recovery diode 4.

Figure 3:
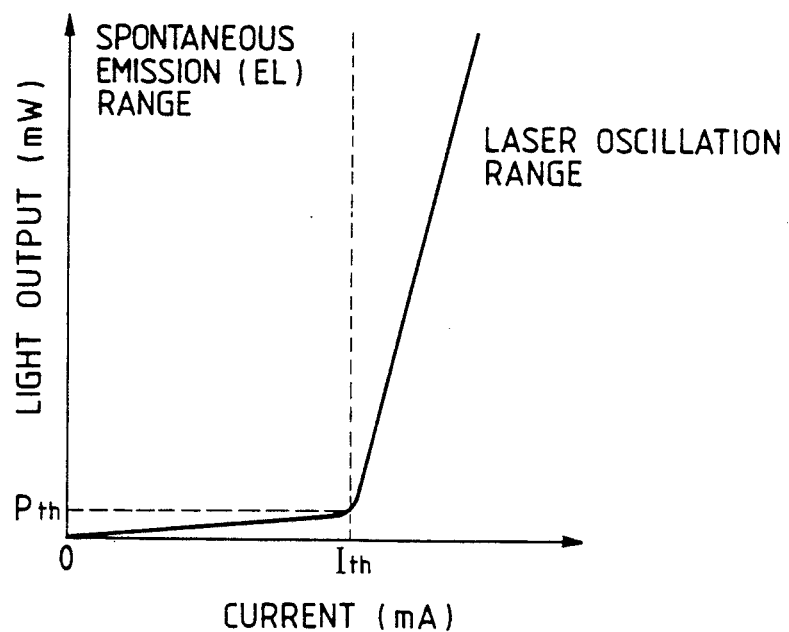
FIG. 3 is a graph showing the current vs. light output characteristic of a semiconductor laser diode.

The junction point of the inductor 3 and step-recovery diode 4, which serves as the output terminal of the voltage modifying means 2, is connected to one end of a variable capacitor 7. The other end of the variable capacitor 7 is connected to the anode of a semiconductor laser diode 9, whose cathode is grounded. The anode of the laser diode 9 is also connected to a bias current source 10 and a protective diode 8. The protective diode 8 is provided to protect the laser diode 9 against the application of a reverse voltage. As FIG. 3 shows, the laser diode 9 has a particular point at which the light output increases abruptly with respect to the current injected (the current value at that point is called a "threshold current"). Hence, the bias current source 10 is used to provide the laser diode 9 with a bias current to improve its emission rising characteristic.

The operation of the drive device shown in FIG. 1 is described below with reference to the timing charts of FIGS. 2A through 2E.

Figure 2A:
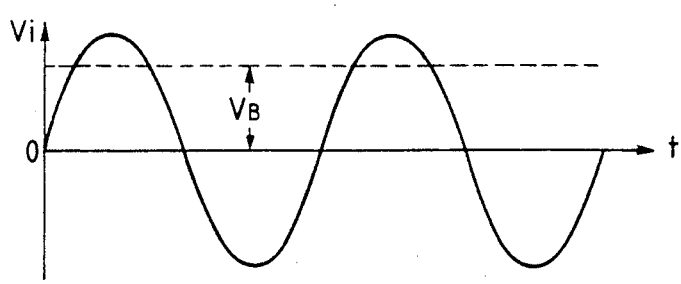
FIGS. 2A through 2E are timing charts showing waveforms generated at various points of said device.
Figure 2B:
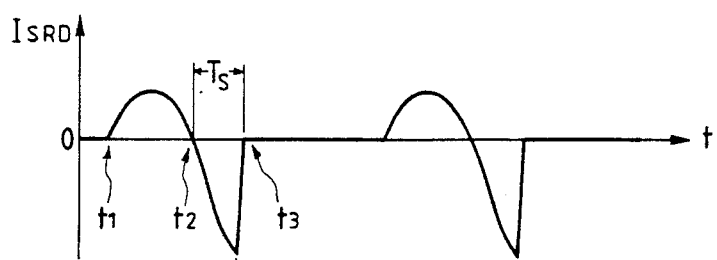

The sinusoidal voltage generating means 1 outputs a sinusoidal voltage $V_i$ of a given amplitude as shown in FIG. 2A. The sinusoidal voltage $V_i$ is applied to the anode of the step-recovery diode 4 through the inductor 3. The cathode potential of the step-recovery diode 4 is maintained at $V_B$ by means of the variable voltage source 5, so that when the sinusoidal voltage $V_i$ exceeds $V_B$ (at time $t_l$), the step-recovery diode 4 becomes conductive and a forward current $I_{SRD}$ will flow through the step-recovery diode 4 as shown in FIG. 2B. Even if the sinusoidal voltage $V_i$ later becomes lower than $V_B$ (at time $t_2$), a reverse current will flow through the step-recovery diode 4 during the period $T_s$ as already mentioned in connection with the operation of the step-recovery diode 4. At the end of the period $T_s$ (time $t_3$), the reverse current is abruptly cut off on account of the inherent nature of the step-recovery diode 4.

Figure 2C:
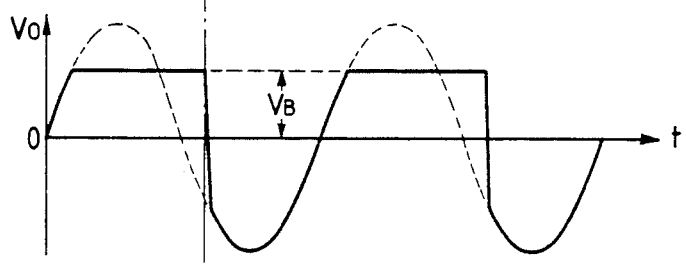

In accordance with the waveform of the current $I_{SRD}$ described above, the anode potential of the step-recovery diode 4, which is the output voltage $V_o$ of the voltage modifying means 2, will assume the waveform shown in FIG. 2C. That is, up to time $t_l$, the step-recovery diode 4 remains non-conductive and hence the sinusoidal voltage $V_i$ appears at the output undistorted. After time $t_l$, the step-recovery diode 4 becomes conductive and the output voltage becomes equal to $V_B$. At time $t_3$ when the reverse current $I_{SRD}$ flowing through the step-recovery diode 4 is cut off, the inductor 3 will induce a voltage $-L \cdot dI_r/dt$, causing the output voltage $V_o$ to fall abruptly from $V_B$ in the negative direction. Thereafter, the step-recovery diode 4 remains non-conductive until the sinusoidal voltage $V_i$ exceeds $V_B$ again, with $V_o$ having the same waveform as $V_i$. The operation described above is subsequently repeated with a period identical to the period of the sinusoidal voltage $V_i$.

Figure 2D:
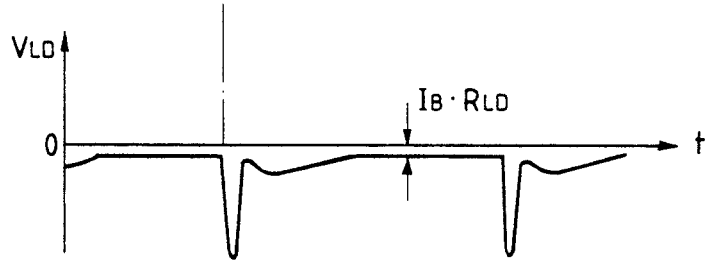
Figure 2E:

The thus obtained voltage $V_o$ is differentiated by passage through the variable capacitor 7 adjusted to have a suitable capacitance, whereby a voltage $V_{LD}$ having the waveform shown in FIG. 2D is produced from the capacitor 7. As a result, the abruptly changing part of the waveform from the voltage modifying means 2 is applied to the laser diode 9 in the form of a short pulse having a width of about 200 picoseconds. In response to such short pulses from the variable capacitor 7, the laser diode 9 produces pulse laser light having a width of about 30 picoseconds as shown in FIG. 2E. The pulse width of the laser light from the laser diode 9 is smaller than that of the applied input voltage because the laser diode 9 has a current vs. light output characteristic such as the one shown in FIG. 3. As one can see from FIG. 3, the pulse width of the laser light from the laser diode 9 can be controlled to some extent by adjusting the bias current $I_B$ from the bias current source 10.

The output values of electric pulses to be applied to the laser diode 9 may vary with the input sinusoidal frequency and this can lead to a corresponding change in the intensity of the pulse laser light from the laser diode 9. However, the intensity of the pulse laser light can be controlled by adjusting the bias current $I_B$ from the bias current source 10 or the amplitude of the sinusoidal voltage $V_i$ produced from the sinusoidal voltage generating means 1. Hence, by performing an appropriate feedback of the output of the laser diode 9, the intensity of the pulse laser light can easily be stabilized in the face of the frequency change.

In the above embodiment, the sinusoidal voltage $V_i$ is provided to the voltage modifying means 2 from the sinusoidal voltage generating means 1. It is noted the voltage waveform supplied to the voltage modifying means 2 may be other repetitive waveforms such as a rectangular wave.

As described on the foregoing pages, by driving a semiconductor laser diode with the device of the present invention, laser light of very short pulses having duration of several tens of picoseconds can be produced in an easy and consistent way, with the repetition frequency being varied over the range of from several megahertz to several hundreds of megahertz.

What is claimed is:

1. A device for driving a light source, comprising:
    means for generating a repetitive sinusoidal input voltage signal having a frequency;
    means for modifying said repetitive sinusoidal input voltage signal to a modified voltage signal having an abrupt transient voltage change, the modifying means including:
    inductor means coupled to said generating means,
    voltage source means for providing a bias voltage, and
    step recovery diode means coupled between the voltage source means and the inductor means for producing said modified voltage signal;
    means coupled to said modifying means for differentiating the modified voltage signal to produce a repetitive pulse voltage signal having a frequency corresponding to the frequence of the sinusoidal input voltage signal; and
    means for providing said pulse voltage signal to drive said light source.

2. The light source drive device according to claim 1, wherein the light source is a semiconductor light-emitting element.

3. The light source drive device according to claim 2, wherein the semiconductor light-emitter element is a laser diode.

4. The light source driving device according to claim 1, further comprising means coupled to the light source for providing a bias current thereto.

* * * * *

UNITED STATES PATENT AND TRADEMARK OFFICE
CERTIFICATE OF CORRECTION

PATENT NO. : 5,062,113
DATED : October 29, 1991
INVENTOR(S) : Akira TAKAHASHI It is certified that error appears in the above-identified patent and that said Letters Patent is hereby corrected as shown below:

Claim 1, column 4, line 55, change "frequence" to --frequency--.

Claim 2, column 4, line 59, change "drive" to --driving--.

Claim 3, column 4, line 62, change "drive" to --driving--.

Claim 3, column 4, line 63, change "light-emitter" to --light-emitting--.

Signed and Sealed this

Twenty-seventh Day of April, 1993

*Attest:*

MICHAEL K. KIRK

*Attesting Officer*     *Acting Commissioner of Patents and Trademarks*